United States Patent [19]

White

[11] Patent Number: 4,588,177

[45] Date of Patent: May 13, 1986

[54] FASTENER FOR HOLDING SIPS ON PC BOARDS DURING SOLDERING

[75] Inventor: Paul K. White, Poway, Calif.

[73] Assignee: Burroughs Corporation, Detroit, Mich.

[21] Appl. No.: 714,725

[22] Filed: Mar. 22, 1985

[51] Int. Cl.$^4$ .............................................. B25B 1/20
[52] U.S. Cl. ...................................... 269/41; 269/47; 269/903
[58] Field of Search ................ 269/47, 49, 52, 41, 269/903; 248/231.9, 231.91, 248, 71, 73; 29/832, 842, 840, 837, 838, 839

[56] References Cited

U.S. PATENT DOCUMENTS

| 268,613 | 12/1882 | Brinkerhoff | 248/71 |
| 2,885,168 | 5/1959 | Silverman | 248/71 |
| 3,154,281 | 10/1964 | Frank | 29/832 |
| 4,175,728 | 11/1979 | Ferguson | 248/71 |
| 4,323,227 | 4/1982 | Turek | 269/903 |
| 4,337,934 | 7/1982 | Caveney | 269/903 |

FOREIGN PATENT DOCUMENTS 1296677  11/1972  United Kingdom ................. 248/73

Primary Examiner—Robert C. Watson
Attorney, Agent, or Firm—Charles J. Fassbender; Kevin R. Peterson

[57] ABSTRACT

A fastener for temporarily holding a SIP in place as it is soldered into a printed circuit board comprises a planar piece of unsolderable material having a body with a slot which is adapted to slip over and hold the SIP; the planar piece of material also has a leg which extends from the body; and the leg has an end section which is parallel to the slot and is adapted to press fit into an unplated anchor hole that goes perpendicular through the board to orient the slot and SIP perpendicular to the board.

11 Claims, 6 Drawing Figures under patent number 4,588,177

FASTENER FOR HOLDING SIPS ON PC BOARDS DURING SOLDERING

BACKGROUND OF THE INVENTION

This invention relates to electromechanical assemblies of single in-line packages (SIPs) on printed circuit (PC) boards; and more particularly, it relates to fasteners for holding the SIPs in place as they are soldered into the boards.

A SIP, as the term is herein used, is any electrical module that has several input/output signal pins which extend from the module in a single straight line and are intended to be soldered into a printed circuit board. That module from which the pins extend may include just a single integrated circuit chip, or it may include a substrate which carries and interconnects several integrated circuit chips.

Frequently, many SIPs (e.g., one hundred) and other electrical components are all mounted in combination for soldering on a single printed circuit board. When the components are mounted closely together, it is important that the SIPs stand perpendicular to the board. If the SIPs lean over, they can short to adjacent components, and they can block the flow of air past the adjacent components.

In the prior art, SIPs have been held upright on a printed circuit board (prior to being soldered in place) by bending and crimping the ends of their input/output pins against the bottom of the board. However, such crimping is undesirable from a repairability standpoint since a SIP with crimped input/output pins is difficult to remove from a board without pulling bonding pads from the board itself.

Accordingly, a primary object of the invention is to provide a fastener for holding SIPs upright on a printed circuit board as they are being soldered in place.

BRIEF SUMMARY OF THE INVENTION

In accordance with the present invention, a fastener is provided for temporarily holding a SIP in place as it is soldered into a printed circuit board, comprising: a planar piece of material having a body with a slot which is adapted to slip over and hold the SIP; the planar piece of material also has a leg which extends from the body; and the leg has an end section which is adapted to engage the board to orient the slot and the SIP perpendicular to the board.

In one embodiment of the fastener, the end section of the leg is parallel to the slot and is adapted to press fit into an anchor hole that goes perpendicular through the board to orient the slot and the SIP. In another embodiment, the planar piece of material is symmetrical about the slot and has two legs, one on each side of the slot. In yet another embodiment, the planar piece of material is unsymmetrical about the slot and has a leg on only one side of it.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 1:
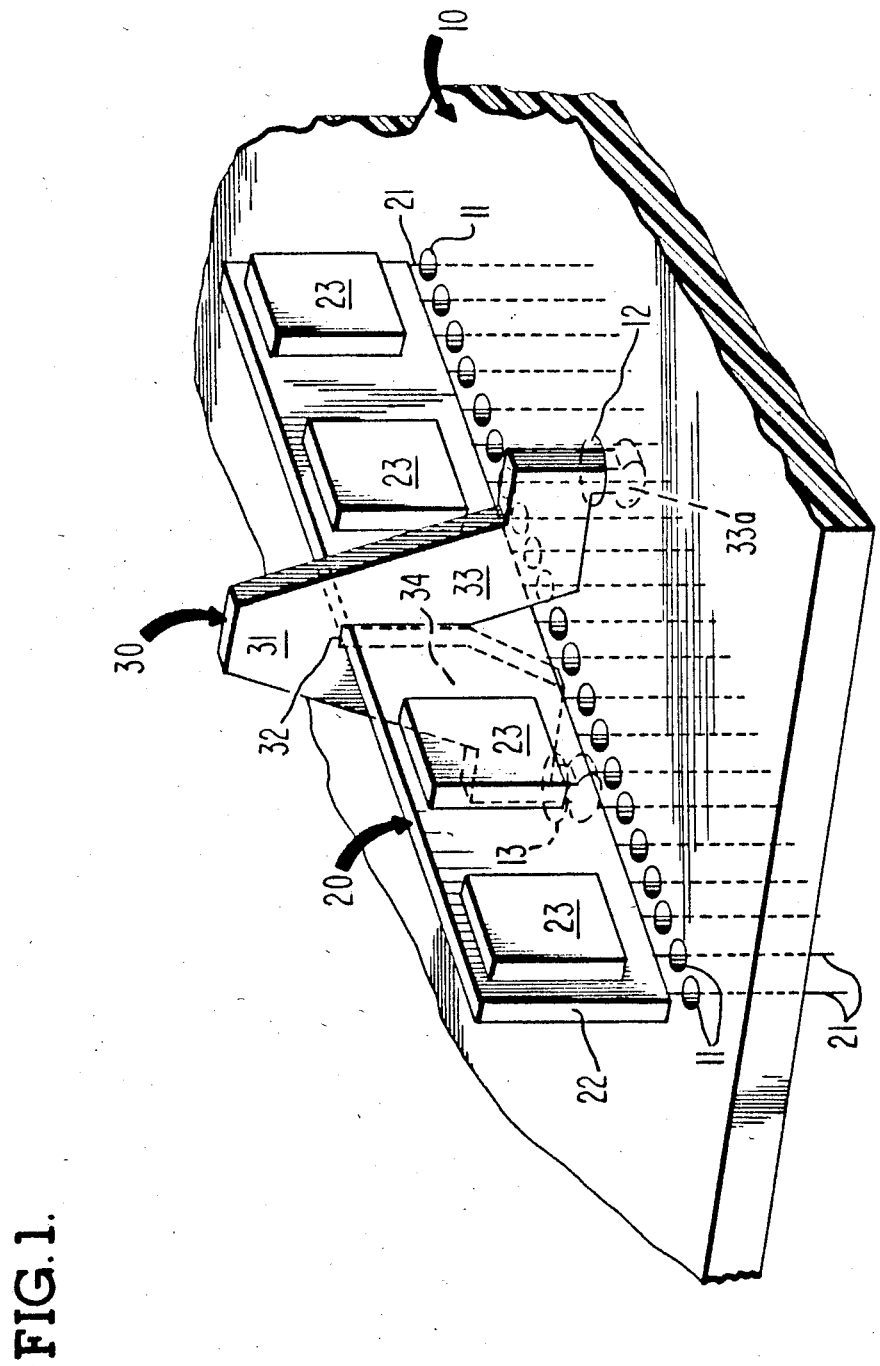
FIG. 1 is a pictorial view of an electromechanical assembly of a printed circuit board, a SIP, and a fastener which is constructed according to the invention.

Referring now to FIG. 1, the structure of a preferred embodiment of the invention as it exists just prior to a wave soldering operation will be described in detail. This embodiment includes a printed circuit board 10, a single in-line package (SIP) 20, and a fastener 30. Board 10 has a set of metal plated holes 11 into which a corresponding set of input/output signal pins 21 loosely fit. Those pins 21 are connected by conductors (not shown) on a substrate 22 in the SIP to several integrated circuit packages 23 which are also part of the SIP.

Fastener 30 operates to temporarily hold the SIP 20 perpendicular to the board 10 as the pins 21 are soldered in place. It is made of a planar piece of unsolderable material which is able to withstand the temperatures of molten solder during the wave soldering operation. Suitably, fastener 30 is made of a plastic, such as teflon, that can withstand temperatures of up to 300° C. for at least ten seconds.

Fastener 30 is symmetrical in shape, and it has a body 31 with a slot 32 which is slipped over and holds onto the SIP 20. A pair of legs 33 and 34 extend from the body over respective non-plated anchor holes 12 and 13 which go perpendicularly through board 10. Legs 33 and 34 have respective ends 33a and 34a which are parallel to slot 32 and which are press fitted straight into the anchor holes 12 and 13. This holds SIP 20 perpendicular to board 10. (Note: SIP 20 in FIG. 1 hides items 34, 34a and 13, but all of those items are visible in FIGS. 2b and 2c.)

Reference should now be made to FIGS. 2a–2d which illustrate the steps by which the structure of FIG. 1 is assembled and soldered together. First, beginning with FIG. 2a, it shows a cross section taken through SIP 20 before the fastener 30 is put in place. At that stage of the assembly process, SIP 20 is lopsided (not perpendicular to board 10). This is because the I/O pins 21 fit loosely into the holes 11, and because the SIP's center of gravity is not directly over the pins. Reference numeral 11a indicates metal plating on the sidewalls of the holes 11; and that metal connects to other conductors (not shown) in board 10 which in turn connect to other electrical components (not shown) both on and off the board. Anchor holes 12 and 13 have no such metal plating.

Figure 2A:
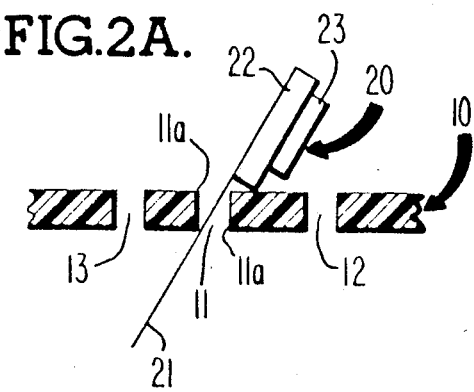
FIGS. 2a–2d are cross-sectional views which illustrate the steps by which the structure of FIG. 1 is assembled and soldered together.
Figure 2B:
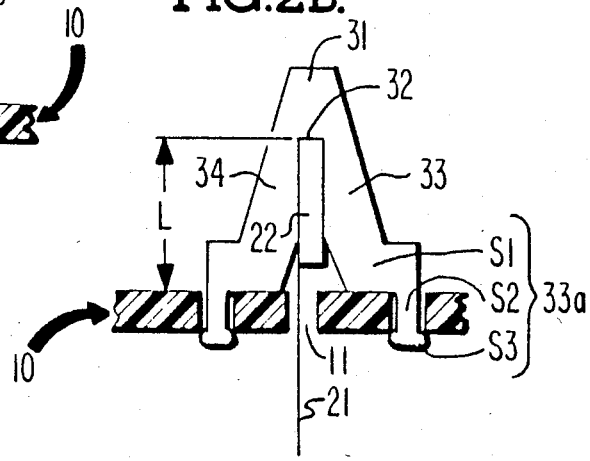

Considering next FIG. 2b, it shows a cross section taken through SIP 20 after fastener 30 has been put in place. Preferably, as FIG. 2b shows, the end 33a of leg 33 has three sections S1, S2, and S3. Section S1 is too large to fit through anchor hole 12 and it rests on board 10; section S2 is parallel to slot 32, and it is the same length as and fits easily through anchor hole 12; and section S3 is rounded and just a little bit (one to three mils) larger than the anchor hole 12. Section S3 is compressed as it is press fitted through the anchor hole 12, and then it expands after it passes through the hole 12 to firmly hold the fastener in place. Leg 34 has a similar shape.

Figure 2C:
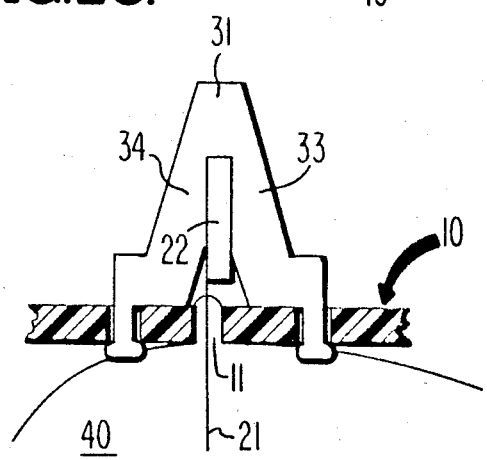

Also preferably, as FIGS. 2b and 2c show, the length of slot 32 is equal to a predetermined maximum distance by which the SIP 20 is permitted to extend above board 10. This distance is indicated in FIG. 2b by the letter "L". Prior to the soldering operation, SIP 20 may be a small distance (e.g., five mils) from the end of slot 32 due to various dimensional tolerances. This is shown in FIG. 2B. However, as the solder wave 40 passes beneath board 10, the SIP 20 is pushed further into slot 32 by the solder wave 40 until the SIP hits the end of the slot. This is shown in FIG. 2c.

Also, solder in the wave moves by capillary action to fill hole 11 in which the pins 21 lie. This occurs because the holes 11 are metal plated and the pins 21 are also metal. However, the solder 40 does not fill any of the vacancies in the anchor holes 12 and 13 because those anchor holes have no metal plating and the fastener 30 is made of a nonsolderable material.

Figure 2D:
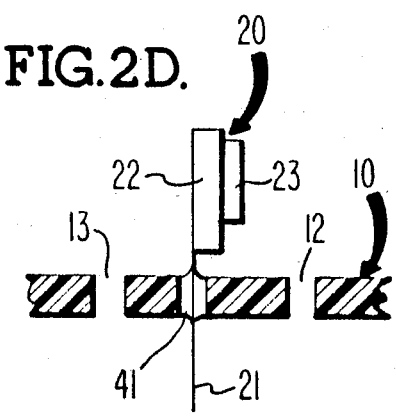

After the soldering operation is complete, the fastener 30 can simply be pulled off of the SIP 20 to thereby yield the assembly of FIG. 2d. There, the SIP 20 is held perpendicular to board 10 and at the correct height above board 10 by hardened solder fillet 41. Fastener 30 which was removed from the FIG. 2d assembly can be used in another soldering operation or it can simply be discarded.

A preferred embodiment of the invention has now been described in detail. In addition, however, many changes and modifications can be made to those details without departing from the nature and spirit of the invention. For example, as one alternative, the fastener 30 may be made to have an unsymmetrical shape by eliminating leg 34. In that case, the fastener is as indicated by reference numeral 50 in FIG. 3. With this change, anchor hole 13 can also be eliminated.

Figure 3:
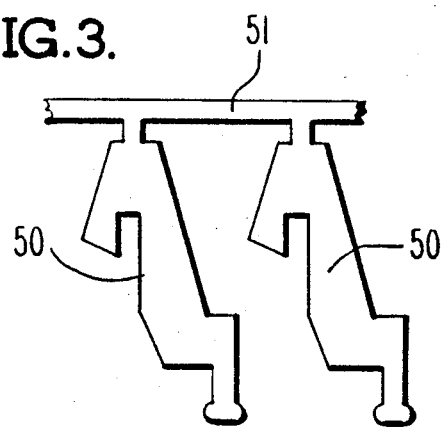
FIG. 3 illustrates a second embodiment of the invention.

In another modification, which FIG. 3 also shows, the fasteners are fabricated such that a large number of them (e.g., fifty) are interconnected by a thin strip 51. Then when several SIPs are mounted alongside of one another on a board, the needed number of fasteners can be acquired in one piece by cutting strip 51 at the appropriate place. To fabricate the interconnected fasteners, they may be punched from a large sheet, or they may be molded.

Accordingly, since many modifications can be made to the illustrated embodiments, it is to be understood that the invention is not limited to those details but is defined by the appended claims.

What is claimed is:

1. An electromechanical assembly comprising: a printed circuit board; a SIP having a set of input/output signal pins that are loosely fitted into a corresponding set of holes in said board; and a fastener for temporarily holding said SIP in said board as said pins are soldered in place; said fastener including a planar piece of unsolderable material having a body with a slot which is slipped over and holds said SIP; said planar piece of material further having a leg which extends from said body; and said leg having an end section which is parallel to said slot and is press fitted into an anchor hole that is perpendicular through said board to orient said slot and said SIP perpendicular to said board.

2. An assembly according to claim 1 wherein said set of holes have solderable sidewalls and said anchor hole has unsolderable sidewalls.

3. An assembly according to claim 1 wherein said planar piece of material is symmetrical about said slot and has two legs, one on each side of said slot.

4. An assembly according to claim 1 wherein said planar piece of material is unsymmetrical about said slot and has a leg on only one side thereof.

5. An assembly according to claim 1 wherein said slot has a length equal to a predetermined maximum distance for said SIP to extend above said board.

6. An electromechanical assembly comprising: a printed circuit board; a SIP having a set of input/output signal pins that are loosely fitted into a corresponding set of holes in said board; and a fastener for temporarily holding said SIP in place as it is soldered into said printed circuit board; said fastener having a body with a slot which is adapted to slip over and hold said SIP, and also having a leg which extends from said body and engages said board to orient said SIP perpendicular to said board.

7. An assembly according to claim 6 wherein a section of said leg is adapted to press fit into an anchor hole through said board to orient said slot and said SIP.

8. An assembly according to claim 7 wherein said section of said leg has a compressible rounded tip which is slightly larger than said anchor hole.

9. An assembly according to claim 8 wherein said fastener is symmetrical about said slot and has two legs, one on each side of said slot.

10. An assembly according to claim 8 wherein said fastener is unsymmetrical about said slot and has a leg on only one side thereof.

11. An assembly according to claim 8 wherein said slot has a length that equals a predetermined maximum distance for said SIP to extend above said board.

* * * * *